(12) United States Patent
Baraszu et al.

(10) Patent No.: US 9,506,992 B2
(45) Date of Patent: Nov. 29, 2016

(54) SYSTEMS AND METHODS FOR DETECTING HIGH-VOLTAGE CONTACTOR STATE OF HEALTH

(71) Applicant: GM GLOBAL TECHNOLOGY OPERATIONS LLC, Detroit, MI (US)

(72) Inventors: Robert C. Baraszu, Dearborn, MI (US); Andrew J. Namou, West Bloomfield, MI (US); David S. Maxwell, Madison Heights, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 14/668,784

(22) Filed: Mar. 25, 2015

(65) Prior Publication Data

US 2016/0282420 A1    Sep. 29, 2016

(51) Int. Cl.
*G01R 31/36*    (2006.01)
*G05D 1/00*    (2006.01)

(52) U.S. Cl.
CPC ....... *G01R 31/3679* (2013.01); *G01R 31/3648* (2013.01); *G05D 1/0055* (2013.01)

(58) Field of Classification Search
CPC .. G01R 31/00; G01R 31/024; G01R 31/025; G01R 31/3278; B60R 25/00
See application file for complete search history.

(56) References Cited

U.S. PATENT DOCUMENTS

2012/0105065 A1*    5/2012    Namou .............. G01R 31/3275
324/415

* cited by examiner

*Primary Examiner* — Michael D Lang
(74) *Attorney, Agent, or Firm* — Phillips Ryther & Winchester; John P. Davis

(57) ABSTRACT

Systems and methods are disclosed for determining a weld state of a contactor (e.g., normal, partially welded, and/or welded states) based on a variety of actuator coil characteristics during actuation. In some embodiments, the disclosed systems and methods may be utilized in connection with determining contactor weld states in a variety of contactor designs. In further embodiments, the disclosed systems and methods may utilize a probability weighted score accounting for contactor design characteristics and information obtained from a reference contactor to identify a weld state associated with a contactor device.

16 Claims, 6 Drawing Sheets

SYSTEMS AND METHODS FOR DETECTING HIGH-VOLTAGE CONTACTOR STATE OF HEALTH

TECHNICAL FIELD

This disclosure relates to systems and methods for detecting a state of health of a high-voltage contactor in a battery system. More specifically, but not exclusively, the systems and methods of the present disclosure provide for determination of a state of health relating to a weld state of a high-voltage contactor using actuator current and voltage measurement characteristics.

BACKGROUND

Passenger vehicles often include electric batteries for operating features of a vehicle's electrical and drivetrain systems. For example, in a hybrid-electric vehicle ("HEV"), a plug-in hybrid electric vehicle ("PHEV"), a fuel cell electric vehicle ("FCEV"), or a purely electric vehicle ("EV"), an energy storage system ("ESS") (e.g., a rechargeable ESS) may be used to power electric drivetrain components of the vehicle (e.g., electric drive motors and the like). The ESS may store high-voltage electrical energy, which may be transmitted to vehicle systems via a high-voltage ("HV") bus having positive and negative conductors or rails. The ESS may be selectively coupled to the positive and negative conductors or rails via one or more selectively switched electric contactors.

Contacts in a HV contactor may be held open by a spring and/or another mechanical means. To close the contactor, an actuator coil in the contactor may be energized to move the contacts against the bias of the spring and/or mechanical means, thereby closing the contactor. In some circumstances, contacts in the HV contactor may experience electrical arcing when actuated. Such arcing may cause the contacts to become welded and/or partially welded together (e.g., when contacts may remain closed and/or partially closed after the actuator coil is de-energized), potentially resulting in certain undesirable conditions. Conventional systems and methods for detected welded contactors (e.g., using current rise time only) may identify welded contactors in some instances, but may nevertheless still allow certain welded and/or partially welded contactors to go undetected and may be restricted for use in connection a limited set of contactor designs.

SUMMARY

Systems and methods are presented for detecting welded and/or partially welded contacts in a HV contactor. In some embodiments, the disclosed systems and methods may utilize a variety of characteristics of a contactor actuator coil current at the time of contactor actuation (e.g., closure and/or opening) to detect normal, partially welded, and/or welded contactor states. Embodiments of the disclosed systems and methods may be utilized in connection with determining contactor weld state in a variety of contactor designs. In certain embodiments, the disclosed systems and methods may utilize a probability weighted score accounting for certain contactor design characteristics (e.g., actuator, coil, and/or current characteristics, etc.) and information obtained from a reference contactor to identify a weld state associated with a contactor device.

In some embodiments, the disclosed systems and methods may provide for advanced warning to an associated vehicle control system and/or vehicle operator prior to the occurrence of a complete contactor weld. Such advanced warning may allow for the control system and/or other vehicle systems to operate in a limited operating mode until repairs are made and/or to alert the operator to seek vehicle services.

In certain embodiments, a method for determining a weld state of a contactor included in a vehicle may include receiving current information from a current sensor and voltage information from a voltage sensor associated with an actuator coil of the contactor following initiation of actuation of the contactor. Based on the received current and voltage information, a plurality of characteristics may be identified. These characteristics may include, for example, an actuator coil current rise time following the initiation of actuation of the contactor, maximum derivative of the actuator coil current following the initiation of actuation of the contactor, a contactor closing time following the initiation of actuation of the contactor, and/or a number of sign changes of a derivative of the actuator coil current following the initiation of actuation of the contactor.

The identified characteristics may be compared to characteristics associated with a reference contactor. Based on the results of the comparison, a weld state of the contactor may be identified (e.g., a welded contactor state, a partially welded contactor state, a fully welded contactor state, etc.). In certain embodiments, a weighted model may be applied based on a design of the contactor to the plurality of characteristics to generate a plurality of weighted characteristics, and the plurality of weighted characteristics may be compared to the characteristics associated with the reference contactor. Further embodiments may include implementing a protective action in response to a determined weld state (e.g., providing a notification to an operator of the vehicle of the determined weld state, operating the vehicle in a limited operating mode based on the determined weld state, etc.).

Embodiments of aforementioned method may be performed, at least in part, by system including associated current and voltage sensors and/or implemented using a non-transitory computer-readable medium storing associated executable instructions.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Figure 1:
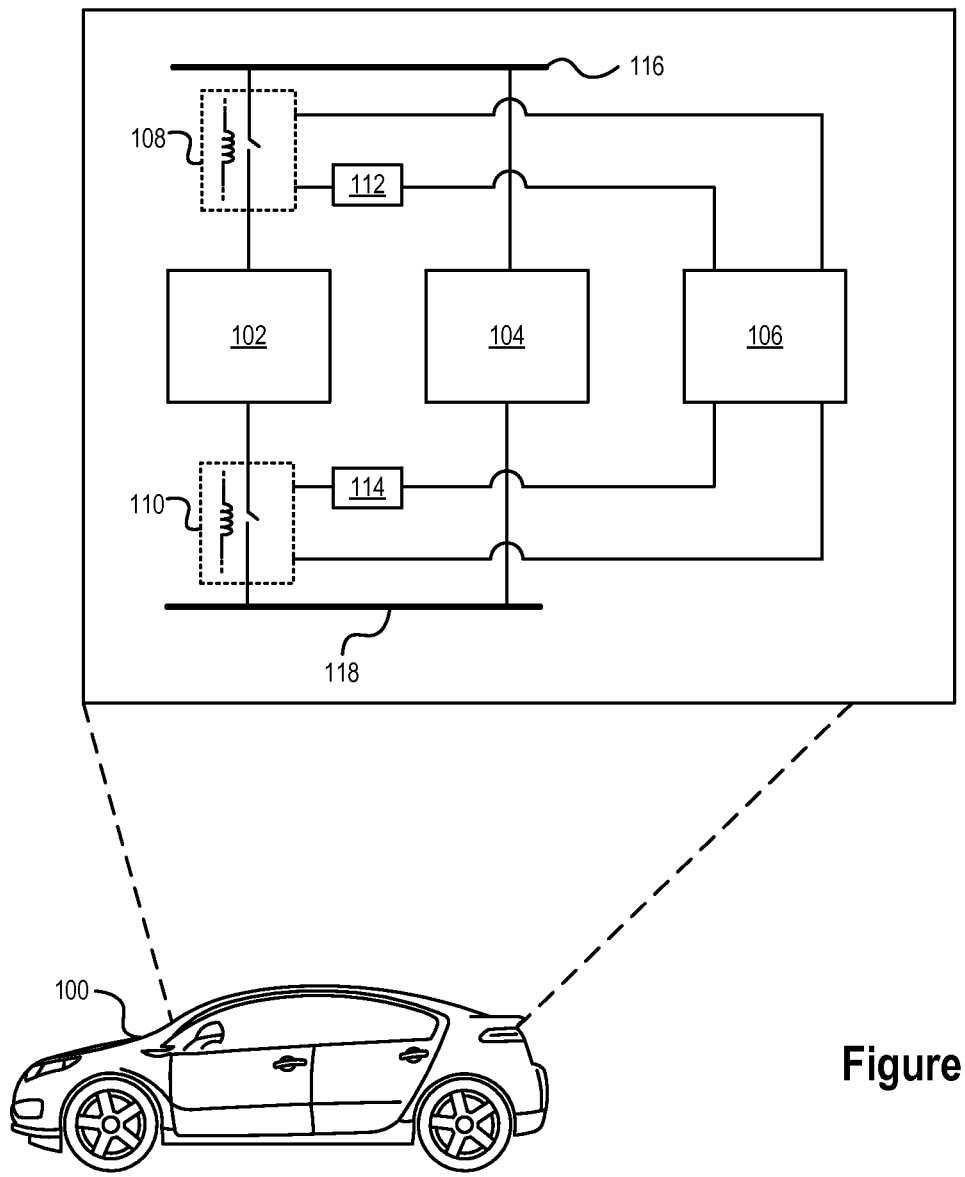
FIG. 1 illustrates an exemplary battery system included in a vehicle consistent with embodiments disclosed herein.

A detailed description of systems and methods consistent with embodiments of the present disclosure is provided below. While several embodiments are described, it should be understood that the disclosure is not limited to any one embodiment, but instead encompasses numerous alternatives, modifications, and equivalents. In addition, while numerous specific details are set forth in the following description in order to provide a thorough understanding of the embodiments disclosed herein, some embodiments can be practiced without some or all of these details. Moreover, for the purpose of clarity, certain technical material that is known in the related art has not been described in detail in order to avoid unnecessarily obscuring the disclosure.

The embodiments of the disclosure will be best understood by reference to the drawings, wherein like parts may be designated by like numerals. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

Systems and methods disclosed herein may be utilized in connection with determining a weld state of a contactor (e.g., welded, unwelded, partially welded, etc.) by measuring characteristics of a contactor actuator coil current and/or voltage during contactor actuation (e.g., closure and/or opening) and comparing such characteristics to that of an unwelded reference contactor (e.g., a normally operating contactor). For example, a maximum derivative of the actuator current may be compared to a calibrated and/or learned value from a reference unwelded contactor, a closing time may be compared to a calibrated and/or learned value for a reference unwelded contactor, a number of sign changes of the derivative of actuator current may be compared to a calibrated and/or learned value for a reference unwelded contactor, and/or the current rise time (e.g., L/R time constant) may be compared to a calibrated and/or learned value for a reference unwelded contactor.

Based on a specific contactor design, weights can be assigned to each of the above comparison measures indicating relative influence on weld characterization for a particular design. For example, a weight of zero may indicated that a particular characteristic may not be reliably used to detect a welded or partially welded state. A weight of one, on the other hand, may indicate that a particular characteristic has more significant bearing on the reliable detection of a partially or fully welded state.

For each of the measured characteristics, a measure of closeness to a reference contactor may be evaluated as a value between zero and/or one, although other scales may also be utilized. Zero may, for example, indicate that a measure is far from the normal reference measure, while one may, for example, indicate that a measure is similar to the normal reference measure (e.g., what may be expected from a normally operating contactor).

For each characteristic, the measure of closeness may be multiplied by an applicability weight associated with a particular contactor design and then be summed. The final sum may be divided by the sum of the weights resulting in a final measure of closeness to a reference contactor (e.g., a normally operating unwelded contactor). One may indicate normal operation, zero may indicate a fully welded contactor, and values in between may indicate a partially welded state.

FIG. 1 illustrates an exemplary ESS 102 included in a vehicle 100 consistent with embodiments disclosed herein. The vehicle 100 may be a motor vehicle, a marine vehicle, an aircraft, and/or any other type of vehicle, and may include any suitable type of drivetrain for incorporating the systems and methods disclosed herein. Additional embodiments of the disclosed systems and methods may be utilized in connection with any other type of ESS 102 including, for example, stationary ESS systems (e.g., back-up power for a building and/or the like).

As illustrated, vehicle 100 may include an ESS 102 configured to provide electrical power to certain components of the vehicle 100. For example, the ESS 102 may be configured to provide power to electric drivetrain components 104 of the vehicle 100. In certain embodiments, the drivetrain components 104 may comprise one or more electric motors such as, for example, one or more permanent magnet synchronous motors ("PMSMs"), induction motors, permanent magnet synchronous reluctance motors, switched reluctance motors, asynchronous motors, and/or any other types of suitable electric motor.

The ESS 102 may include one or more battery packs and/or battery cells (not shown) suitably sized to provide electrical power to vehicle systems utilizing any suitable battery technology or combination thereof. Suitable battery technologies may include, for example, lead-acid, nickel-metal hydride ("NiMH"), lithium-ion ("Li-Ion"), Li-Ion polymer, lithium-air, nickel-cadmium ("NiCad"), valve-regulated lead-acid ("VRLA") including absorbed glass mat ("AGM"), nickel-zinc ("NiZn"), molten salt (e.g., a ZEBRA battery), and/or other suitable battery technologies. In some embodiments, the ESS 102 may be a HV ESS.

The ESS 102 may store HV electrical energy that may be provided to vehicle systems via a HV bus having primary and secondary conductors or rails 116, 118. The primary rail 116 may be selectively coupled to a positive terminal of the ESS 102 by a primary contactor 108. Similarly, the secondary rail 118 may be selectively coupled to a negative terminal of the ESS 102 by a secondary contactor 110. Electrical power provided by the ESS 102 to the primary and secondary rails 116, 118 may in turn be provided to a power inverter system (not shown). The power inverter system may be coupled to drivetrain components 104, thereby delivering electric power from the ESS 102 to drivetrain components 104 when the primary and secondary contactors 108, 110 are closed.

In some embodiments, the primary and secondary contactors 108, 110 may comprise one or more solenoid driven switches. For example, as illustrated, the primary and secondary contactors 108, 110 may comprise one or more actuator solenoids and/or coils configured to actuate an associated contact switch (e.g., by energizing the actuator solenoid and/or coil to move the contacts of the switch against the bias of an associated spring and/or other mechanical means, thereby closing the switch).

In certain embodiments, the primary and/or secondary contactors 108, 110 may be actuated in response to control signals provided by at least one communicatively coupled control system 106 (e.g., via one or more control lines). In some embodiments, the control system 106 may comprise an internal battery pack control system, an external battery system control system, and/or any other vehicle control and/or computer system. In further embodiments, the control system 106 may be configured to provide information to and/or receive information from other systems included in the vehicle 100 and/or an operator of the vehicle 100. For example, the control system 106 may be communicatively coupled to a vehicle infotainment and/or alert system and be configured to provide information regarding a state of a primary and/or secondary contactors 108, 110 (e.g., a weld state and/or the like) and/or any other information regarding the battery system 102 (e.g., estimated capacity, pack life, SOC, SOH, operating time, operating temperature, etc.). Although illustrated in connection with a single control system 106, it will be appreciated that embodiments of the disclosed systems and methods may be implemented using a plurality of suitable control and/or computing systems.

The control system 106 may receive certain information related to the primary and/or secondary contactors 108, 110 from one or more communicatively coupled sensors 112, 114. The sensors 112, 114 may comprise, for example, voltage sensors, current sensors, temperature sensors, and/or the like, and may provide information used to, among other things, determine a state of a primary and/or secondary contactors 108, 110 (e.g., a weld state and/or the like). Consistent with embodiments disclosed herein, using a number of characteristics of a contactor actuator coil current measured by sensors 112, 114 (e.g., current sensors or the like) at the time of contactor closure and/or opening, normal, partially welded, and/or welded contactor states may be determined.

It will be appreciated that a number of variations can be made to the architecture, relationships, and examples presented in connection with FIG. 1 within the scope of the inventive body of work. For example, certain device and/or system functionalities described above may be integrated into a single device and/or system and/or any suitable combination of devices and/or systems in any suitable configuration. Similarly, embodiments of the disclosed systems and methods may be utilized in a variety of contactors that, in certain circumstances, may not comprise primary and/or secondary contactors 108, 110 of a ESS 102 associated with a vehicle 100. Thus it will be appreciated that the architecture, relationships, and examples presented in connection with FIG. 1 are provided for purposes of illustration and explanation, and not limitation.

Figure 2:
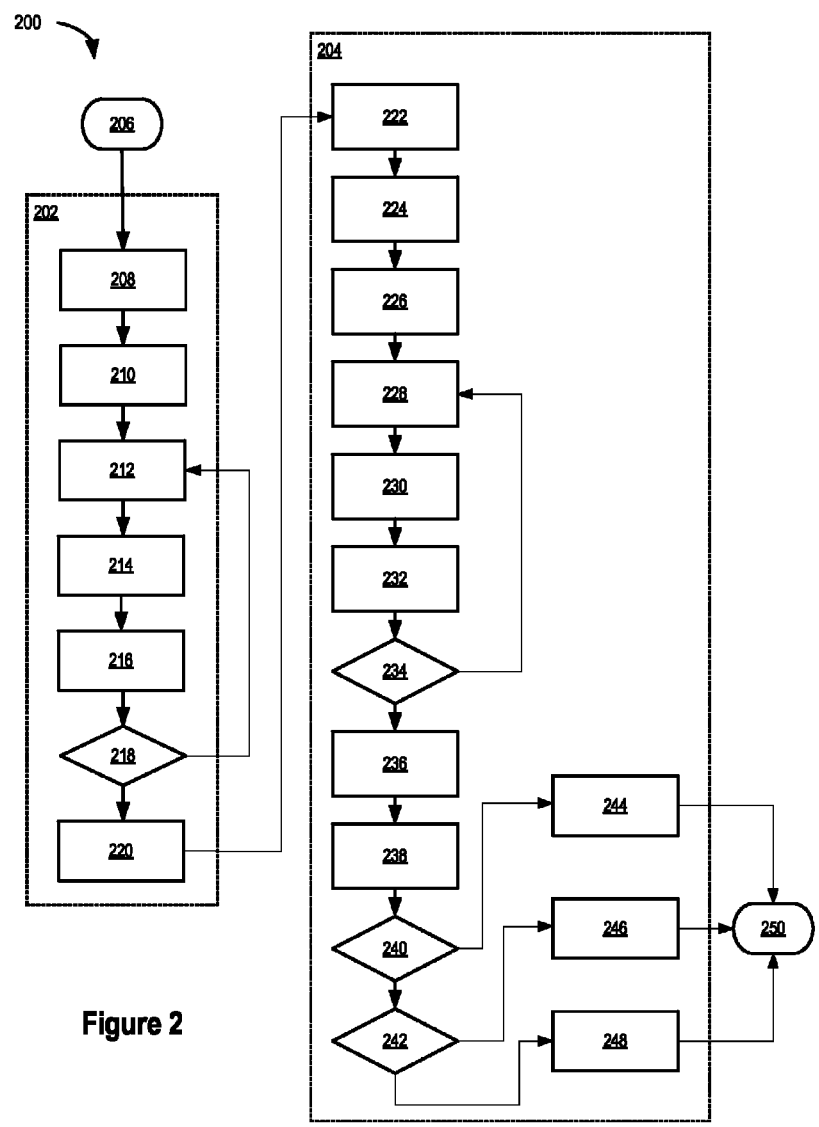
FIG. 2 illustrates a flow chart of an exemplary method for determining a weld state of a high-voltage contactor consistent with embodiments disclosed herein.

FIG. 2 illustrates a flow chart of an exemplary method 200 for determining a weld state of a high-voltage contactor consistent with embodiments disclosed herein. In some embodiments, the illustrated method 200 and/or any of its constituent steps may be performed using, at least in part, a control and/or computing system and/or one or more sensors (e.g., current sensors, voltage sensors, and/or the like) associated with contactors of a battery system (e.g., HV contactors and/or the like), although other suitable systems and/or combination of systems may also be utilized.

The method 200 may comprise one or more data acquisition steps 202 (e.g., real-time data acquisition steps) and/or one or more weld state determination steps 204. At 206, the method 200 may initiate. At 208, contactor actuation (e.g., closure and/or opening) may be initiated by generating a control signal configured to energize an actuator coil and/or solenoid included in a contactor. In some embodiments, this may comprise applying a current to the contactor control line, thereby causing the actuator coil and/or solenoid to actuate the contactor. In further embodiments, this may comprise generating a control signal configured to denergize an actuator coil and/or solenoid included in a contactor. In some embodiments, this may comprise removing a current to the contactor control line, thereby causing the actuator coil and/or solenoid to open the contactor.

A data acquisition timer may be started at 210. At 212, one or more sensors may be used to measure data relating to the contactor. For example, in some embodiments, contactor control line current and/or voltage may be measured over a particular period of time (e.g., 1 ms). Data measured at 212 may be stored at 214 (e.g., stored in one or more data buffers and/or the like). The data acquisition timer may be incremented at 216 (e.g., incremented by 1 ms). At 218 a determination may be made as to whether the time indicated by the data acquisition timer is less than a data acquisition time window threshold (e.g., 100 ms). If so, the method 200 may return to 212 and additional data may be measured and stored at 214, until the determination at 218 results in a determination that the data acquisition time window has elapsed (i.e., that the time indicated by the data acquisition timer is equal or greater than the data acquisition time window threshold). At 220, stored measurement data (e.g., current and/or voltage data) may be communicated to one or more hardware and/or systems and/or methods implementing the various weld state determination steps 204.

At 222, the communicated measurement data (e.g., current and/or voltage data) may be received. At 224, a resistance across the contactor may be determined based on the measurement data (e.g., by dividing measured steady state voltage across the contactor, $V_{ss}$, by a measured steady state current across the contactor, $I_{ss}$). An L/R time constant for the actuator current rise time at contactor closure and/or opening may further be determined at 224.

A calculation loop counter may be set to zero at 226. At 228, a derivative of the actuator current, $dI/dt$, may be calculated. A variety of characteristics of the derivative of the actuator current calculated at 228 may be identified at 230. For example, a maximum of the derivative of the actuator current (i.e., a maximum of $dI/dt$) and a number of sign changes of the derivative of the actuator current, $dI/dt$, may be identified at 230. At 232, a contactor closing time may also be identified.

At 234, a determination may be made whether the calculation loop counter exceeds a maximum count threshold. In some embodiments, the maximum count threshold may be determined by dividing a total data acquisition time by a sample time (e.g., 100 ms acquisition time/1 ms sample time results in calculation count threshold of 100). If not, the method 200 may return to 228 and steps 228-232 may continue to be performed, until the determination at 234 results in a determination that the maximum count threshold has been reached. Once the maximum count threshold has been reached, the method 200 may proceed to 236.

At 236, the characteristics identified at 230 and 232 may be compared to calibrated characteristics associated with a reference contactor. That is, the maximum derivative of the actuator current may be compared to a calibrated and/or learned value from a reference unwelded contactor, the closing time may be compared to a calibrated and/or learned value for a reference unwelded contactor, the number of sign changes of the derivative of actuator current may be compared to a calibrated and/or learned value for a reference unwelded contactor, and/or the current rise time (e.g., L/R time constant) may be compared to a calibrated and/or learned value for a reference unwelded contactor. In some embodiments, at least some of these comparisons may be performed as a function of temperature and/or resistance of the contactor and/or an associated actuator It certain embodiments, based on contactor design, weights may be assigned to each of the above comparison measures indicating a relative influence on weld state characterization for a particular design. For example, a weight of zero may indicate that a particular characteristic may not be used to detect weld state in a particular contactor design. A weight of one, on the other hand, may indicate that a particular characteristic has more bearing on the detection of a weld state in the particular contactor design.

For each of the measured characteristics, a measure of closeness to a normally operating and/or a reference contactor may be evaluated as a value between zero and one, although other suitable value ranges may also be utilized in connection with the disclosed embodiments. Zero may indicate that the measure does not correspond with a normally operating contactor, while one may indicate that the measure is what is expected for a normally operating contactor.

For each characteristic, the measures of closeness may be multiplied by an associated design applicability weight and then may be summed. In certain embodiments, the final sum is divided by the sum of the weights resulting in a final measure of closeness to a reference contactor associated with an un-welded state. At 238, this measure of closeness may be compared with one or more thresholds. For example, a measure of closeness of one may indicate an unwelded contactor and a measure of closeness of zero may indicate a fully welded contactor.

As an example, a determination may be made at 240 whether the measure of closeness exceeds a first threshold associated with a welded contactor. If so, the contactor weld state may be determined to be unwelded at 244. A determination may be made at 242 whether the measure of closeness is between the first threshold and a second lower threshold. If so, the contactor weld state may be determined to be partially welded at 246. Otherwise, if the measure of closeness is below the second threshold, the contactor weld state may be determined to be fully welded at 248. While the above description and the illustrated method 200 utilize two comparison thresholds and three contactor weld states, it will be appreciated that any number of comparison thresholds and/or weld states (e.g., a plurality of partially welded states having various degrees) may be utilized in connection the disclosed systems and methods. The method 200 may proceed to terminate at 250.

Figure 3A:
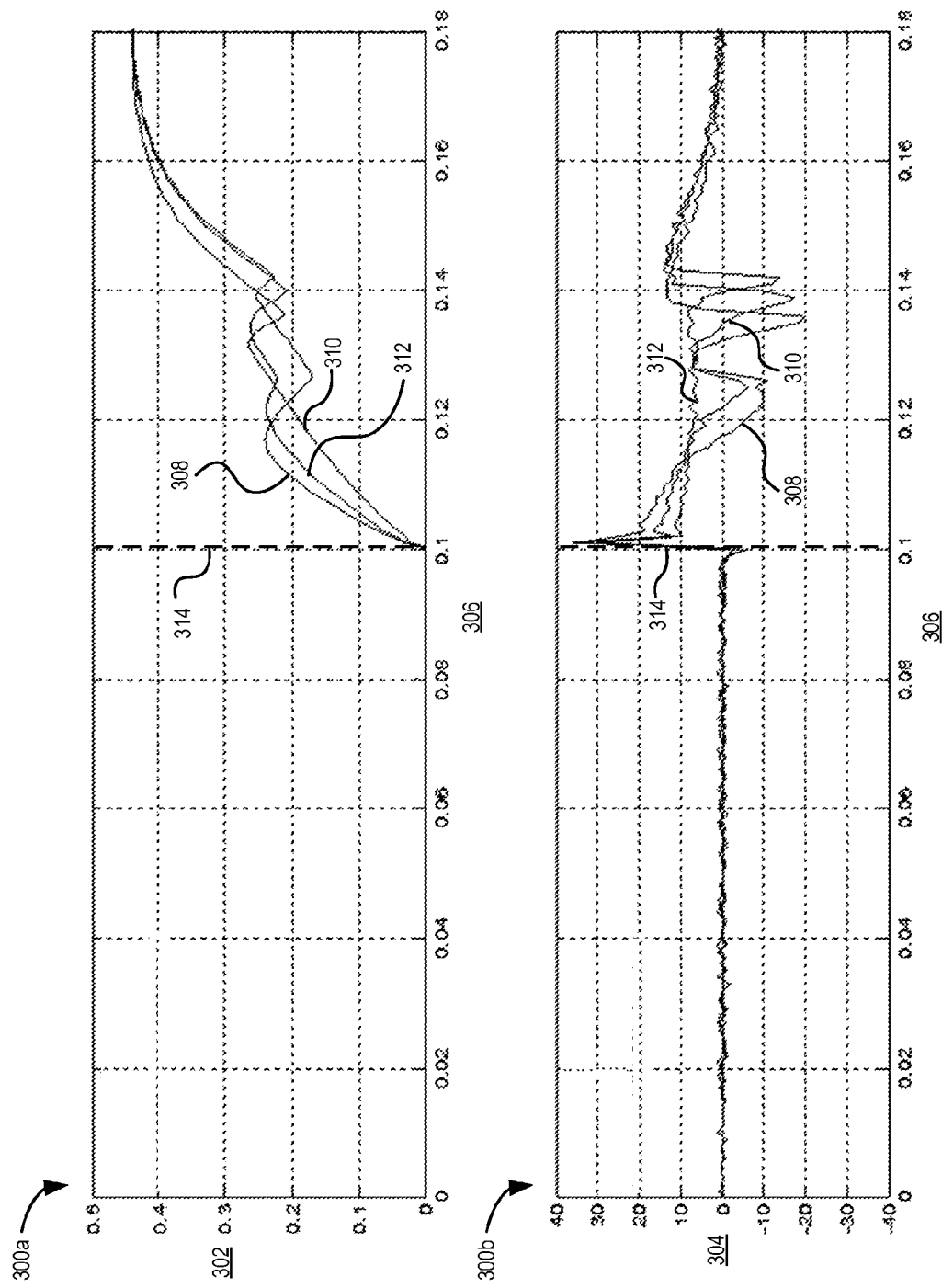
FIG. 3A illustrates graphs showing exemplary contactor actuator coil current and a derivative of the current during contactor closure and/or opening for contactors experiencing various weld states consistent with embodiments disclosed herein.

FIG. 3A illustrates graphs 300a, 300b showing an exemplary contactor actuator coil current 302 and a derivative of the current 304 during contactor closure and/or opening consistent with embodiments disclosed herein. Particularly, graph 300a illustrates an exemplary actuator coil current 302 over time 306 of a contactor associated with an unwelded state 308, a partially welded state 310, and a welded state 312. Graph 300b illustrates an exemplary derivative of actuator coil current 304, dI/dt, over time 306 of a contactor associated with an unwelded state 308, a partially welded state 310, and a welded state 312.

A variety of exemplary characteristics of actuator current of a contactor following initiation of contactor closure and/or opening, indicated by line 314, are reflected in graphs 300a, 300b. Consistent with embodiments disclosed herein, these characteristics may be utilized, in a weighted method based on contactor design, to identify an associated weld state of a contactor. For example, as illustrated, various characteristics including, without limitation, current rise times, sign changes of the derivative of actuator current, maximum derivative of actuator current (e.g., maximum negative derivative of actuator current), and/or contactor close times may be utilized to identify an associated weld state (e.g., 308-312) of a contactor.

Figure 3B:
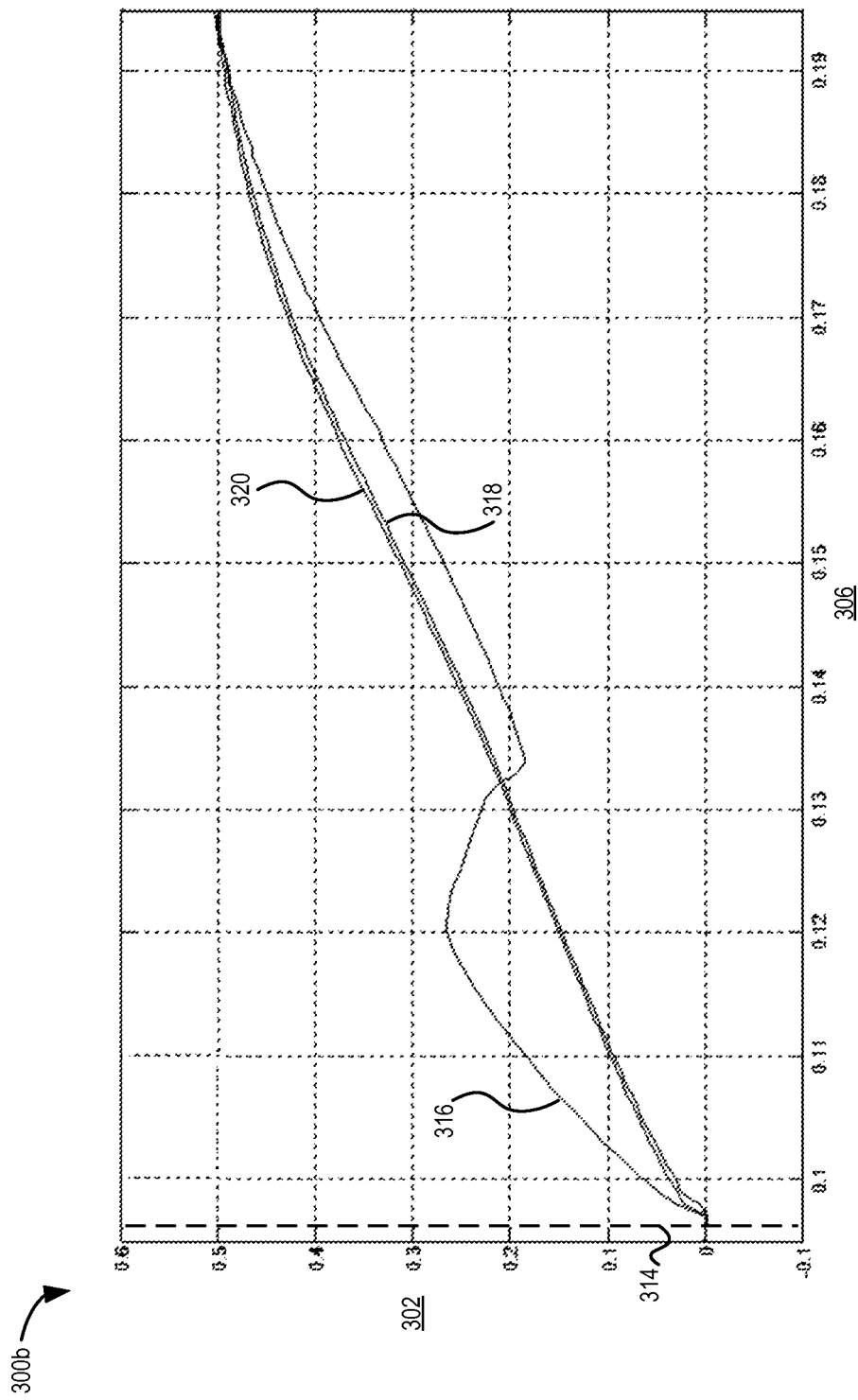
FIG. 3B illustrates a graph showing exemplary contactor actuator coil current response during contactor closure and/or opening for an exemplary contactor experiencing various weld states consistent with embodiments disclosed herein.

FIG. 3B illustrates a graph 300c showing exemplary contactor actuator coil current response during contactor closure and/or opening for an exemplary contactor design experiencing various weld states consistent with embodiments disclosed herein. Particularly, graph 300c illustrates an exemplary actuator coil current 302 over time 306 of a contactor associated with an unwelded state 316, a partially welded state 318, and a welded state 320.

A variety of exemplary characteristics of actuator current of a contactor following initiation of contactor actuation, indicated by line 314, are reflected in graph 300c. For example, in the contactor design associated with the various current responses illustrated in connection with graph 300c, the derivative of actuator coil current of an unwelded contactor may experience two sign changes (e.g., dI/dt>0=>dI/dt<0=>dI/dt>0) and one maximum negative derivative. In contrast, the contactor design associated with graph 300a of FIG. 3A, may exhibit up to four sign changes and up to two occurrences of a similar maximum negative derivative. The two occurrences of the similar maximum negative derivative may be similar, so additional measurements of associated sign changes may provide additional information used in connection with weld state characterization.

In the contactor design associated with graph 300c of FIG. 3B, however, if the maximum negative derivative of the actuator current is determined to be non-zero, it may be determined that there will be two sign changes since the physical characteristics of the particular actuator design may not allow for the number of sign changes to be anything other than zero or two. Accordingly, the weight of the number of sign changes in the weld characterization methods disclosed herein may be set to a lower weight (e.g., zero) since the number of sign changes of the maximum negative derivate of actuator current does not provide significant information that may be used to identify a weld state. In this manner, weights can be assigned to a characteristic indicating its relative influence on weld characterization for a particular contactor design.

Figure 4:
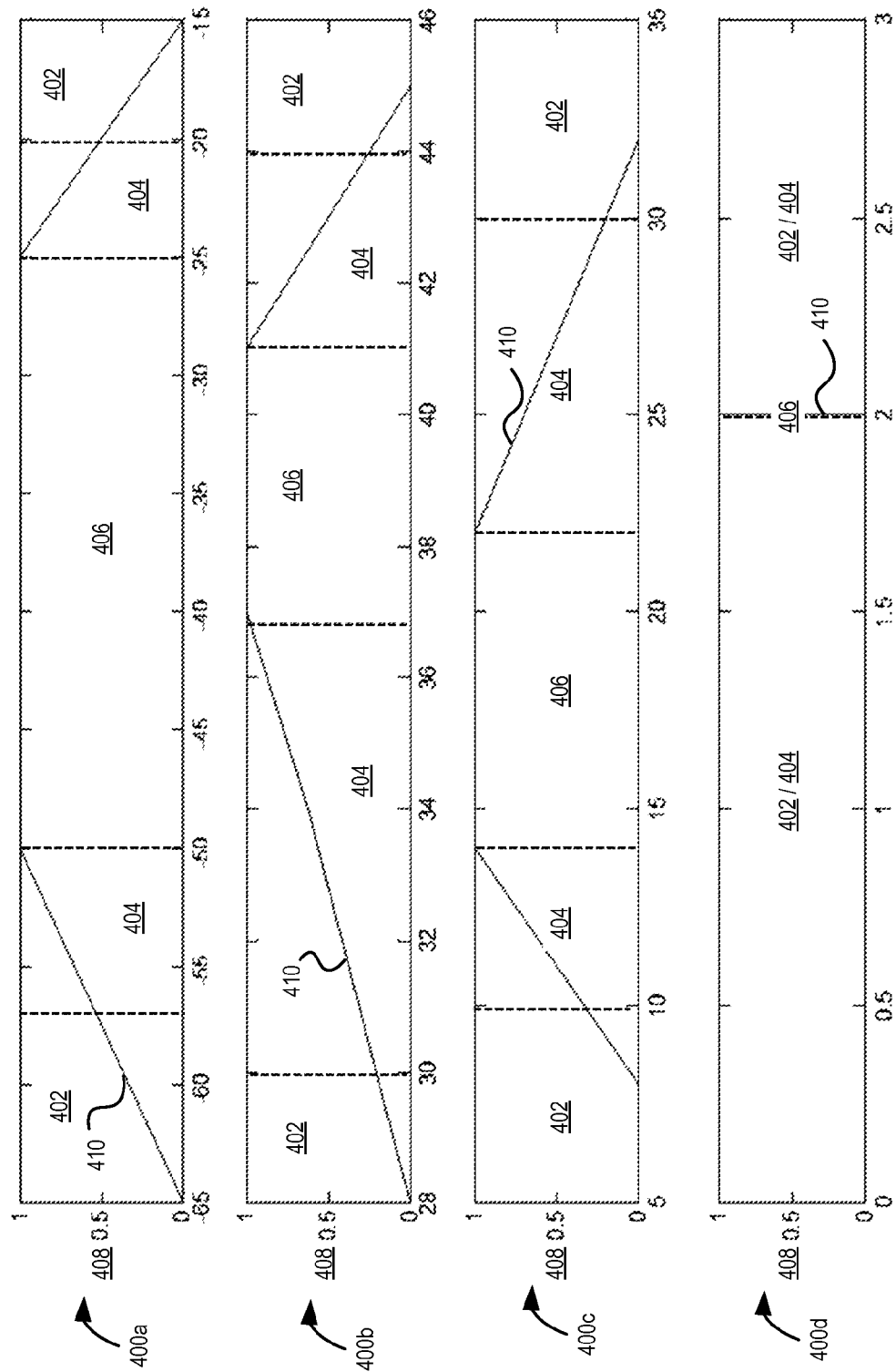
FIG. 4 illustrates graphs showing exemplary closeness to a reference for various contactor current characteristics and associated contactor weld states consistent with embodiments disclosed herein.

FIG. 4 illustrates graphs 400a-400d showing exemplary closeness 408 to a reference contactor for various contactor current characteristics and associated contactor weld states consistent with embodiments disclosed herein. Particularly, graph 400a illustrates exemplary closeness to a reference for maximum negative derivative of actuator current and associated weld states, graph 400b illustrates exemplary closeness to a reference for an expected actuator current rise time and associated weld states, graph 400c illustrates exemplary closeness to a reference for an expected contactor closing time and associated weld states, and graph 400d illustrates exemplary closeness to a reference for an expected number of sign changes in a derivative of actuator current and associated weld states.

In certain embodiments, certain exemplary thresholds and/or ranges in the various illustrated characteristics (e.g., indicated by dotted lines) may be associated with various contactor weld states including likely fully welded states 402, likely partially welded states 404, and likely unwelded states 406. Consistent with embodiments of the systems and methods, such thresholds may be utilized in connection with comparing a final measure of closeness to determine an associated contactor state.

Figure 5:
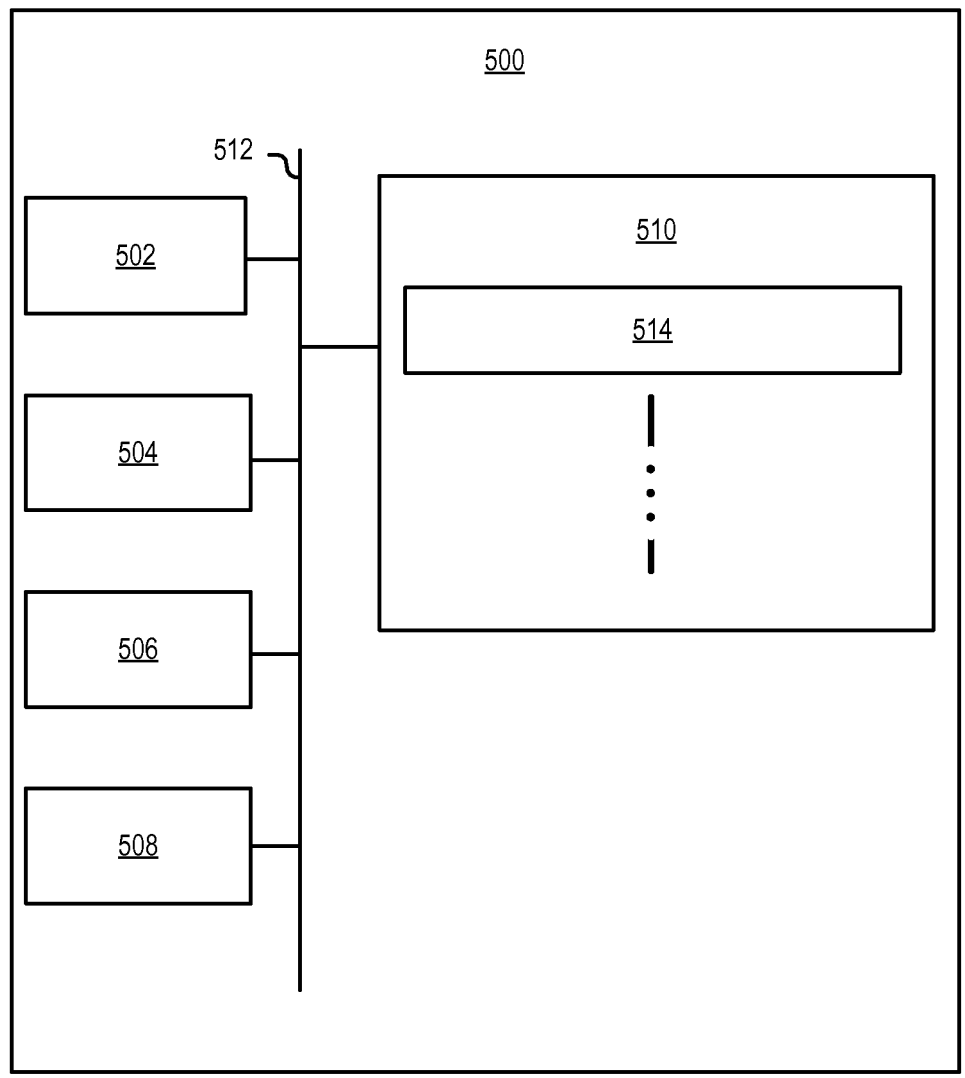
FIG. 5 illustrates an exemplary system for implementing certain embodiments of the systems and methods disclosed herein

FIG. 5 illustrates an exemplary system for implementing certain embodiments of the systems and methods disclosed herein. In certain embodiments, the computer system 500 may be a personal computer system, a server computer system, an on-board vehicle computer, an internal battery pack control system, an external battery system control system, and/or any other type of system suitable for implementing the disclosed systems and methods. In further embodiments, the computer system 500 may be any portable electronic computer system or electronic device including, for example, a notebook computer, a smartphone, and/or a tablet computer.

As illustrated, the computer system 500 may include, among other things, one or more processors 502, random access memory ("RAM") 504, a communications interface 506, a user interface 508, and a non-transitory computer-readable storage medium 510. The processor 502, RAM 504, communications interface 506, user interface 508, and computer-readable storage medium 510 may be communicatively coupled to each other via a common data bus 512. In some embodiments, the various components of the computer system 500 may be implemented using hardware, software, firmware, and/or any combination thereof.

The user interface 508 may include any number of devices allowing a user to interact with the computer system 500. For example, the user interface 508 may be used to display an interactive interface to a user. The user interface 508 may be a separate interface system communicatively coupled with the computer system 500 or, alternatively, may be an integrated system such as a display interface for a laptop or other similar device. In certain embodiments, the user interface 508 may be produced on a touch screen display. The user interface 508 may also include any number of other input devices including, for example, keyboard, trackball, and/or pointer devices.

The communications interface 506 may be any interface capable of communicating with other computer systems, peripheral devices, and/or other equipment communicatively coupled to computer system 500. For example, the communications interface 506 may allow the computer system 500 to communicate with other computer systems (e.g., computer systems associated with external databases and/or the Internet), allowing for the transfer as well as reception of data from such systems. The communications interface 506 may include, among other things, a modem, a satellite data transmission system, an Ethernet card, and/or any other suitable device that enables the computer system 500 to connect to databases and networks, such as LANs, MANs, WANs and the Internet. In further embodiments, the communications interface 506 may further be capable of communication with one or more sensors (e.g., current sensors, voltage sensors) and/or other systems configured to measure and/or otherwise provide information for use in connection with the disclosed embodiments.

Processor 502 may include one or more general purpose processors, application specific processors, programmable microprocessors, microcontrollers, digital signal processors, FPGAs, other customizable or programmable processing devices, and/or any other devices or arrangement of devices that are capable of implementing the systems and methods disclosed herein.

Processor 502 may be configured to execute computer-readable instructions stored on non-transitory computer-readable storage medium 510. Computer-readable storage medium 510 may store other data or information as desired. In some embodiments, the computer-readable instructions may include computer executable functional modules 514. For example, the computer-readable instructions may include one or more functional modules configured to implement all or part of the functionality of the systems and methods described above. Specific functional models that may be stored on computer-readable storage medium 510 may include a module configured to calculate various actuator coil current characteristics, a module configured to apply a probability weighted score in connection with such characteristics and a particular contactor design, a module configured to compare weighted characteristics with reference characteristics to identify contactor weld states, and/or any other module or modules configured to implement the systems and methods disclosed herein.

Although the foregoing has been described in some detail for purposes of clarity, it will be apparent that certain changes and modifications may be made without departing from the principles thereof. Certain features of the embodiments disclosed herein may be configured and/or combined in any suitable configuration or combination. Additionally, certain systems and/or methods disclosed herein may be utilized in battery systems and/or ESS systems not included in a vehicle (e.g., a backup power battery system or the like). It is noted that there are many alternative ways of implementing both the processes and apparatuses described herein. Accordingly, the present embodiments are to be considered illustrative and not restrictive, and the invention is not to be limited to the details given herein, but may be modified within the scope and equivalents of the appended claims.

The foregoing specification has been described with reference to various embodiments. However, one of ordinary skill in the art will appreciate that various modifications and changes can be made without departing from the scope of the present disclosure. Various operational steps, as well as components for carrying out operational steps, may be implemented in alternate ways depending upon the particular application or in consideration of any number of cost functions associated with the operation of the system. Accordingly, any one or more of the steps may be deleted, modified, or combined with other steps. Further, this disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced, are not to be construed as a critical, a required, or an essential feature or element.

As used herein, the terms "comprises" and "includes," and any other variation thereof, are intended to cover a non-exclusive inclusion, such that a process, a method, an article, or an apparatus that comprises a list of elements does not include only those elements but may include other elements not expressly listed or inherent to such process, method, system, article, or apparatus. Also, as used herein, the terms "coupled," "coupling," and any other variation thereof are intended to cover a physical connection, an electrical connection, a magnetic connection, an optical connection, a communicative connection, a functional connection, and/or any other connection.

Those having skill in the art will appreciate that many changes may be made to the details of the above-described embodiments without departing from the underlying principles of the invention. The scope of the present invention should, therefore, be determined only by the following claims.

The invention claimed is:

1. A method for determining a weld state of a contactor included in a vehicle comprising:
   receiving current information from a current sensor associated with an actuator coil of the contactor following initiation of actuation of the contactor;
   receiving voltage information from a voltage sensor associated with an actuator coil of the contactor following initiation of actuation of the contactor;
   identifying a plurality of characteristics based on the received current and voltage information;
   comparing the plurality of characteristics to characteristics associated with a reference contactor; and
   determining a weld state of the contactor based on the comparison,
   wherein the plurality of characteristics comprise an actuator coil current rise time following the initiation of actuation of the contactor and a number of sign changes of a derivative of the actuator coil current following the initiation of actuation of the contactor.

2. The method of claim 1, wherein the weld state comprises at least one of a welded contactor state, a partially welded contactor state, and a fully welded contactor state.

3. The method of claim 1, wherein the plurality of characteristics comprise a maximum derivative of the actuator coil current following the initiation of actuation of the contactor.

4. The method of claim 1, wherein the plurality of characteristics comprise a contactor closing time following the initiation of actuation of the contactor.

5. The method of claim 1, wherein the method further comprises applying a weighted model based on a design of the contactor to the plurality of characteristics to generate a plurality of weighted characteristics, wherein comparing the plurality of characteristics to characteristics associated with a reference contactor comprises comparing the plurality of weighted characteristics to the characteristics associated with the reference contactor.

6. The method of claim 1, wherein the method further comprises implementing at least one protective action in response to the determined weld state.

7. The method of claim 6, wherein the at least one protective action comprises providing a notification to an operator of the vehicle of the determined weld state.

8. The method of claim 6, wherein the at least one protective action comprises operating the vehicle in a limited operating mode based on the determined weld state.

9. A system for determining a weld state of a contactor included in a vehicle, the system comprising:
   a current sensor configured to measure current information relating to a current across an actuator coil of the contactor following initiation of actuation of the contactor;
   a voltage sensor configured to measure voltage information relating to a voltage across the actuator coil of the contactor following initiation of actuation of the contactor;
   a processor communicatively coupled to the current sensor and the voltage sensor; and
   a non-transitory computer readable storage medium communicatively coupled to the processor storing instructions that, when executed by the processor, cause the processor to:
      identify a plurality of characteristics based on the current information and the voltage information;
      compare the plurality of characteristics to characteristics associated with a reference contactor; and
      determine a weld state of the contactor based on the comparison,
   wherein the plurality of characteristics comprise an actuator coil current rise time following the initiation of actuation of the contactor and a number of sign changes of a derivative of the actuator coil current following the initiation of actuation of the contactor.

10. The system of claim 9, wherein the weld state comprises at least one of a welded contactor state, a partially welded contactor state, and a fully welded contactor state.

11. The system of claim 9, wherein the plurality of characteristics comprise a maximum derivative of the actuator coil current following the initiation of actuation of the contactor.

12. The system of claim 9, wherein the plurality of characteristics comprise a contactor closing time following the initiation of actuation of the contactor.

13. The system of claim 9, wherein the instructions are further configured to cause the processor to apply a weighted model based on a design of the contactor to the plurality of characteristics to generate a plurality of weighted characteristics, wherein comparing the plurality of characteristics to characteristics associated with a reference contactor comprises comparing the plurality of weighted characteristics to the characteristics associated with the reference contactor.

14. The system of claim 9, wherein the instructions are further configured to cause the processor to implement at least one protective action in response to the determined weld state.

15. The system of claim 14, wherein the at least one protective action comprises providing a notification to an operator of the vehicle of the determined weld state.

16. The system of claim 14, wherein the at least one protective action comprises operating the vehicle in a limited operating mode based on the determined weld state.

* * * * *